United States Patent [19]
Mitsuya et al.

[11] Patent Number: 5,262,682
[45] Date of Patent: Nov. 16, 1993

[54] LEVEL CONVERTER CIRCUIT HAVING TWO MULTI-COLLECTOR TRANSISTORS FOR SIMPLIFYING CIRCUIT CONFIGURATION

[75] Inventors: Yoshimasa Mitsuya; Katsuya Shimizu, both of Kasugai, Japan

[73] Assignees: Fujitsu Limited, Kawasaki; Fujitsu VLSI Limited, Kasugai, both of Japan

[21] Appl. No.: 797,930

[22] Filed: Nov. 26, 1991

[30] Foreign Application Priority Data

Nov. 28, 1990 [JP] Japan ................. 2-327537

[51] Int. Cl.$^5$ .................. H03K 3/29; H03K 19/0175
[52] U.S. Cl. ................. 307/262; 307/475; 307/290; 307/359; 307/299.3
[58] Field of Search ............... 307/262, 475, 290, 359, 307/299.3

[56] References Cited

U.S. PATENT DOCUMENTS

| | | | |
|---|---|---|---|
| 4,259,601 | 3/1981 | Stein | 307/359 |
| 4,717,839 | 1/1988 | Miller | 307/299.3 |
| 5,132,559 | 7/1992 | Baskett | 307/299.3 |

FOREIGN PATENT DOCUMENTS 0076626  6/1981  Japan ................. 307/290

OTHER PUBLICATIONS

"Input Stage Transconductance Reduction Technique for High-Slew Rate Operational Amplifiers", Schmook, IEEE Journal of Solid-State Circuits vol. SC-10, No. 6, Dec. 1975.

Primary Examiner—Margaret R. Wambach
Attorney, Agent, or Firm—Staas & Halsey

[57] ABSTRACT

A level converter circuit having hysteresis characteristics between an input voltage and an output voltage comprises two multi-collector transistors constituting a differential amplifier, a reference voltage control unit for controlling a reference voltage supplied to the differential amplifier, and an output level switching unit for switching and outputting the output voltage between a first voltage level and a second voltage level. The reference voltage control unit is connected to first collectors of the two multi-collector transistors, and the output level switching unit is connected to second collectors of the two multi-collector transistors. Therefore, an occupied area of the level converter circuit can be small and a circuit configuration can be simplified, and thus the level converter circuit can be applied to a masterslice type LSI. Further, a chip area including the level converter circuit can be small and cost thereof can be reduced.

17 Claims, 9 Drawing Sheets

LEVEL CONVERTER CIRCUIT HAVING TWO MULTI-COLLECTOR TRANSISTORS FOR SIMPLIFYING CIRCUIT CONFIGURATION

BACKGROUND OF THE INVENTION

1. Field of the Invention

The present invention relates to a level converter circuit, more particularly, to a level converter circuit having hysteresis characteristics between an input voltage and an output voltage to convert the input voltage to the output voltage.

2. Description of the Related Art

In recent years, a level converter circuit having hysteresis characteristics have been used for an output circuit of various semiconductor circuits or devices to match the output level thereof to the other semiconductor circuits or devices connected thereto. The level converter circuit is constituted by a hysteresis comparator portion for obtaining hysteresis characteristics and a level converter portion for carrying out level conversion. Further, the level converter portion is constituted by a differential amplifier and an output circuit.

In the related art level converter circuit, the hysteresis comparator portion and the level converter portion are independently provided and they are connected in series. Further, the hysteresis comparator portion is constituted by single collector transistors, or normal type bipolar transistors, and the differential amplifier and the output circuit are constituted by a plurality of transistors and diodes. Therefore, the circuit configuration of the level converter circuit becomes complicated, and the number of elements required for the level converter circuit becomes large.

Consequently, for example, in a masterslice type large scale integration (LSI) circuit, such level converter circuit requiring a complicated circuit configuration and the like cannot be arranged. Further, in another LSI circuit except for the masterslice type, when forming the related art level converter circuit, an occupied area thereof becomes large and cost thereof becomes high.

SUMMARY OF THE INVENTION

An object of the present invention is to provide a level converter circuit having a small occupied area and a simple circuit configuration. Further, another object of the present invention is to provide a level converter circuit suitable for applying a masterslice type LSI. In addition, still another object of the present invention is to provide a level converter circuit that realizes a small chip area and is produced at a low cost.

According to the present invention, there is provided a level converter circuit having hysteresis characteristics between an input voltage and an output voltage, wherein the level converter circuit comprises: an input terminal for receiving the input voltage; an output terminal for outputting the output voltage; a first multi-collector transistor having first and second collector electrodes, an emitter electrode, and a base electrode connected to the input terminal; a second multi-collector transistor having first and second collector electrodes, an emitter electrode, and a base electrode, for constituting a differential amplifier accompanied with the first multi-collector transistor; a reference voltage control unit, connected to the first collector electrode of the first multi-collector transistor and the first collector electrode and the base electrode of the second multi-collector transistor, for controlling a reference voltage supplied to the base electrode of the second multi-collector transistor to realize the hysteresis characteristics; and an output level switching unit, connected to the second collector electrode of the first multi-collector transistor, the second collector electrode of the second multi-collector transistor, and the output terminal, for switching and outputting the output voltage between a first voltage level and a second voltage level.

The emitter electrodes of the first and second multi-collector transistors may be operatively connected to a first power supply line of the first voltage level. Concretely, when the first and second multi-collector transistors are constituted as PNP type multi-collector transistors, and the emitter electrodes of the first and second multi-collector transistors are commonly connected to a high potential power supply line for supplying a positive direct current voltage through a constant current source. Further, when the first and second multi-collector transistors are constituted as NPN type multi-collector transistors, and the emitter electrodes of the first and second multi-collector transistors are commonly connected to a low potential power supply line for supplying a negative direct current voltage through a constant current source.

The reference voltage control unit may comprise a plurality of diodes, and the reference voltage of the reference voltage control unit may be determined in accordance with the forward voltages of the diodes. The reference voltage control unit may be connected to a middle potential power supply line for supplying a middle direct current voltage, and the middle potential power supply line may be specified to the ground line.

The diodes may be connected in series between the middle potential power supply line and the high or low potential power supply line through a constant current source, and the reference voltage of the reference voltage control unit may be determined by a differential value between the middle direct current voltage and the forward voltages of the diodes.

The reference voltage control unit further may comprise first and second single collector transistors constructing a current mirror circuit of the first and second multi-collector transistors. The reference voltage control unit may further comprise a third single collector transistor connected to the second single collector transistor for controlling the reference voltage of the reference voltage control unit. The second single collector transistor may control the reference voltage of the reference voltage control unit.

The output level switching unit may further comprise first and second single collector transistors constructing a current mirror circuit of the first and second multi-collector transistors. The output level switching unit may further comprise a third single collector transistor, connected to the first single collector transistor, for switching and outputting the output voltage.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

First, a level converter according to the related art will be explained, with reference to FIGS. 1 to 4B.

Figure 1:
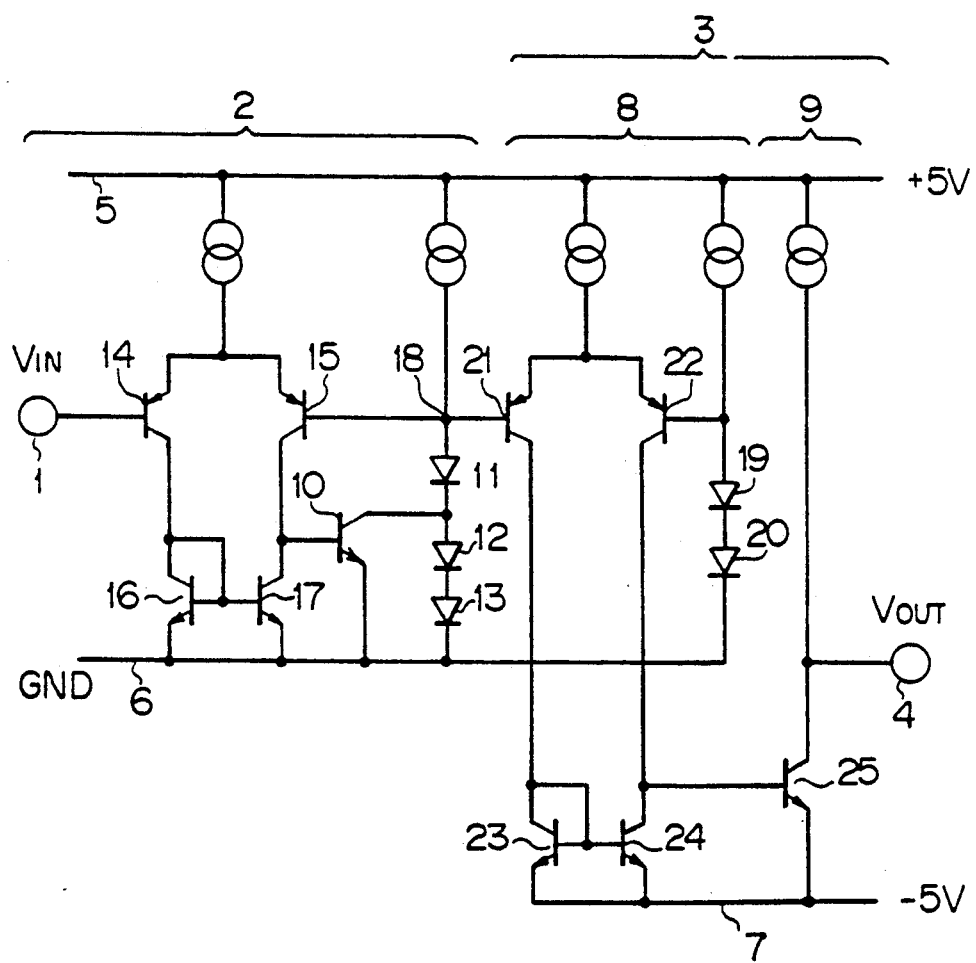
FIG. 1 is a circuit diagram indicating an example of a level converter circuit according to the related art.

FIG. 1 indicates an example of a level converter circuit according to the related art. In FIG. 1, a reference numeral 1 denotes an input terminal, 2 denotes a hysteresis comparator portion for obtaining hysteresis characteristics, 3 denotes a level converter portion for carrying out level conversion, 4 denotes an output terminal, 5 denotes a high potential power supply line for supplying a positive direct current voltage, e.g., +5 volts, 6 denotes a ground line, and 7 denotes a low potential power supply line for supplying a negative direct current voltage, e.g., −5 volts. The level converter portion 3 is constituted by a differential amplifier 8 and an output circuit 9.

In this level converter circuit, a transistor 10 and diodes 11, 12, 13 are used to determine two reference voltages (threshold voltages) of the hysteresis characteristics between an input voltage and an output voltage of the level converter circuit. Note, an output level of the hysteresis comparator portion 2 is changed from a low level to a high level at one of the two reference voltages, and further, the output level of the hysteresis comparator portion 2 is changed from a high level to a low level at the other of the two reference voltages.

Concretely, when one transistor 14 of differential pair transistors is switched ON and the other transistor 15 of the differential pair transistors is switched OFF, both transistors 16 and 17 constituting a current mirror circuit of the differential pair transistors 14 and 15 are switched ON. Therefore, a transistor 10 whose base electrode is connected to collector electrodes of the transistors 15 and 17 is switched OFF, and a level of a node 18 is specified to $3V_D$ (volts) corresponding to the sum of forward voltages of the diodes 11, 12, 13 connected in series between the node 18 and the ground line 6. Note, the reference $V_D$ denotes a forward voltage of one diode.

Conversely, when the transistors 14 and 15 are switched OFF and ON, respectively, the transistors 16 and 17 are switched OFF, and the transistor 10 is switched ON, so that a level of the node 18 is specified to $V_D$ (volts) corresponding to a forward voltage of the diode 11 connected between the node 18 and the collector of the transistor 10, or connected between the node 18 and the ground line 6 through the ON-state transistor 10.

Figure 2:
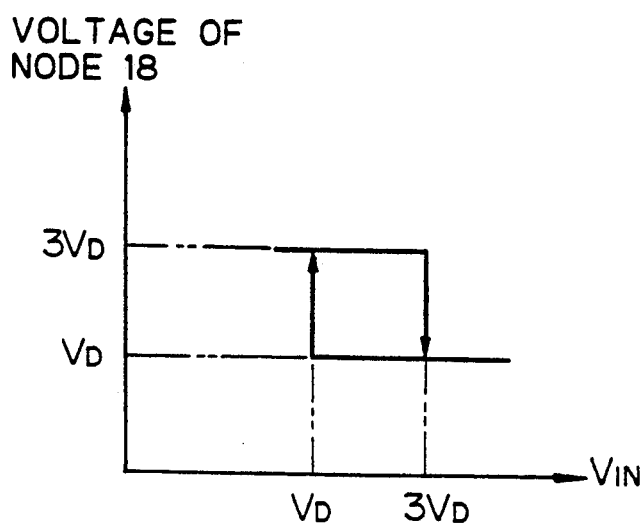
FIG. 2 is a diagram indicating input-output characteristics of a hysteresis comparator portion of the level converter circuit shown in FIG. 1.

FIG. 2 indicates input-output characteristics of a hysteresis comparator portion of the level converter circuit shown in FIG. 1. As described above, the input-output characteristics can be obtained by the hysteresis comparator portion of the level converter circuit shown in FIG. 1.

Incidentally, a reference voltage $V_{ref}$ of the differential amplifier 8 constituting the level converter portion 3 is determined by diodes 19, 20, and thus the reference voltage $V_{ref}$ is specified to $2V_D$ (volts) corresponding to the sum of forward voltages of the diodes 19 and 20. Therefore, when a level of the node 18 is at $V_D$ (volts), one transistor 21 of the differential pair transistors is switched ON and the other transistor 15 of the differential pair transistors is switched OFF, and both transistors 23 and 24 constituting a current mirror circuit of the differential pair transistors 21 and 22 are switched ON. Consequently, a transistor 25 whose base electrode is connected to collector electrodes of the transistors 22 and 24 is switched OFF, and a level of the output terminal 4 is specified to +5 volts.

Conversely, when a level of the node 18 is at $3V_D$ (volts), the transistors 21 and 22 are switched OFF and ON, respectively, the transistors 23 and 24 are switched OFF, and the transistor 25 is switched ON, so that a level of the output terminal 4 is specified to −5 volts.

Figure 3:
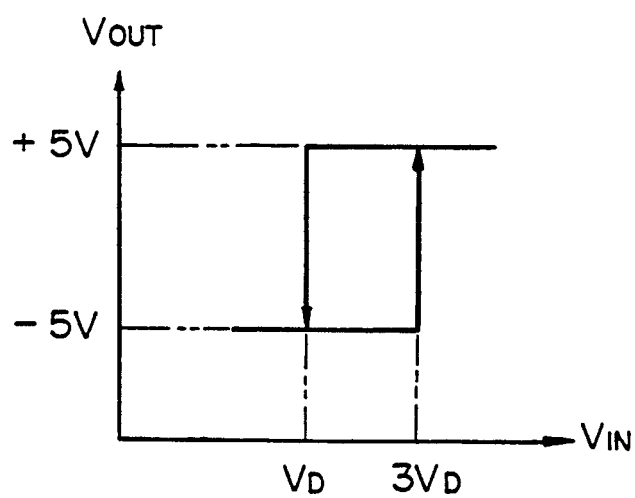
FIG. 3 is a diagram indicating hysteresis characteristics between an input voltage and an output voltage of the level converter circuit shown in FIG. 1.

FIG. 3 indicates hysteresis characteristics between an input voltage and an output voltage of the level converter circuit shown in FIG. 1.

As described above, according to the related art level converter circuit shown in FIG. 1, the characteristics between the input voltage ($V_{IN}$) and the output voltage ($V_{OUT}$) of the level converter circuit are specified as shown in FIG. 3, and level conversion can be carried out under the specific hysteresis characteristics.

Figure 4A:
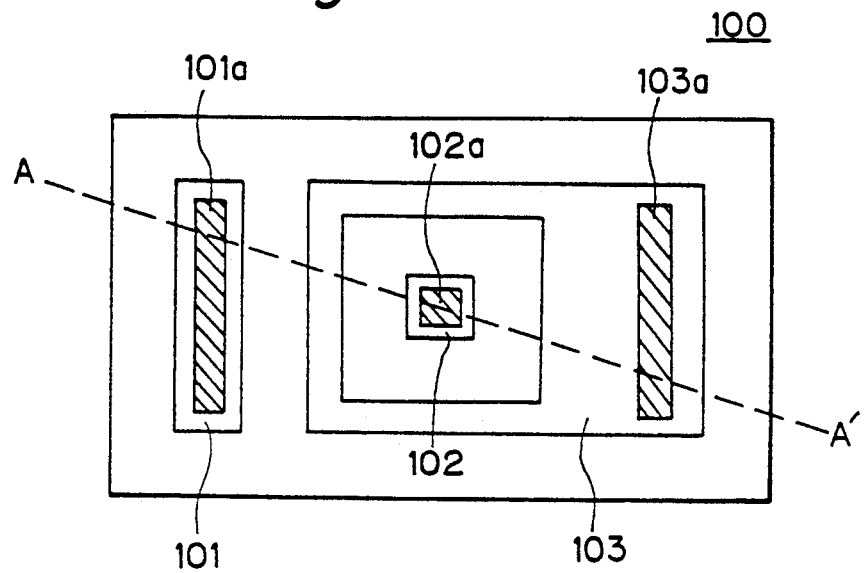
FIG. 4A is a plan diagram indicating an example of a PNP type single collector transistor used in the level converter circuit shown in FIG. 1.
Figure 4B:
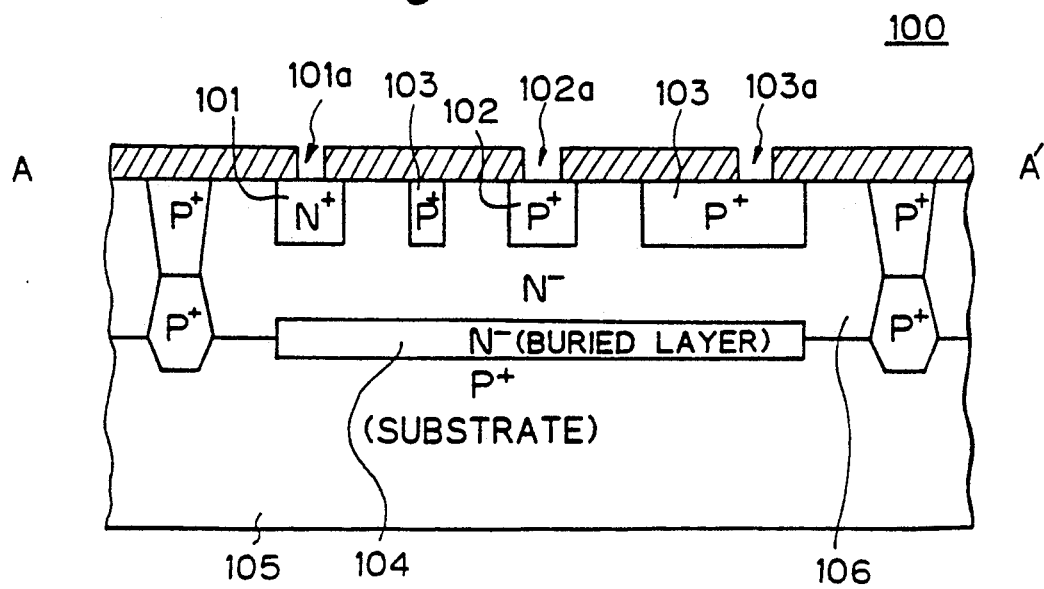
FIG. 4B is a sectional diagram indicating the PNP type single collector transistor cut along a line A—A' shown in FIG. 4A.

FIG. 4A indicates a plan view of an example of a PNP type single collector transistor used in the level converter circuit shown in FIG. 1, and FIG. 4B indicates a sectional view of the PNP type single collector transistor cut along a line A—A' shown in FIG. 4A.

In FIGS. 4A and 4B, a reference numeral 100 denotes a PNP type single collector transistor, or a normal type PNP bipolar transistor, 101 denotes an N+ type base region, 102 denotes a P+ type emitter region, 103 denotes a P+ type collector region, and 101a, 102a, and 103a denote contact holes for the base region 101, the emitter region 102, and the collector region 103. Further, reference numeral 104 denotes an N+ type buried layer, 105 denotes a P+ type substrate, and 106 denotes an N− type transistor region. Note, the PNP type single collector transistor shown in FIGS. 4A and 4B is only one example, and now, various configurations of the PNP type single collector transistor can be provided. Additionally, these days, the PNP type single collector transistor, as well as various types of NPN type single collector transistors, or normal type NPN bipolar transistors are available.

In the related art level converter circuit shown in FIG. 1 using the above PNP (NPN) type single collector transistor, the hysteresis comparator portion 2 and the level converter portion 3 are independently provided and they are connected in series, so that the circuit configuration becomes complicated and the number of the elements required for the level converter circuit becomes large. Therefore, for example, in a masterslice type large scale integration (LSI) circuit, such level converter circuits requiring a complicated circuit configuration and the like cannot be arranged. Further, in another LSI circuit, except for the masterslice type, when forming the related art level converter circuit, an occupied area thereof becomes large and cost thereof becomes high.

Below, the preferred embodiments of a level converter circuit according to the present invention will be explained with reference to FIGS. 5 to 13.

Figure 5:
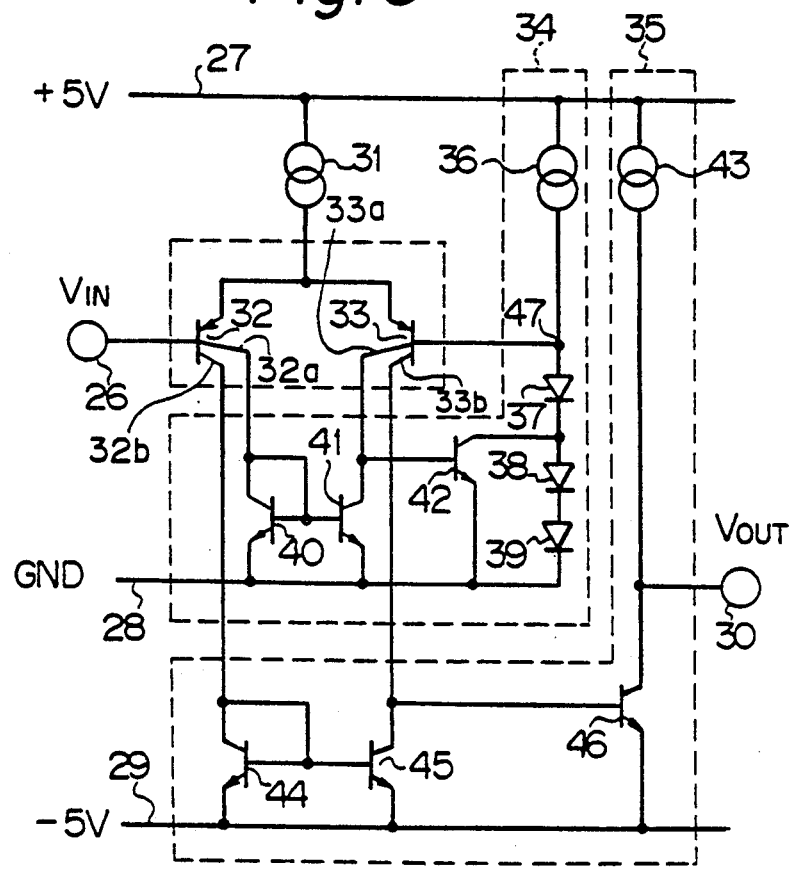
FIG. 5 is a circuit diagram indicating a first embodiment of a level converter circuit according to the present invention.

FIG. 5 indicates a first embodiment of a level converter circuit according to the present invention. In FIG. 5, a reference numeral 26 denotes an input terminal, 27 denotes a high potential power supply line for supplying a positive direct current voltage, e.g., +5 volts, 28 denotes a ground line, and 29 denotes a low potential power supply line for supplying a negative direct current voltage, e.g., −5 volts. Further, a reference numeral 30 denotes an output terminal, 31 denotes constant current source, 32 and 33 denote PNP type multi-collector transistors each including two collector electrodes, 34 denotes a reference voltage control circuit, and 35 denotes an output level switching circuit.

The reference voltage control circuit 34 is used to control and establish a reference voltage for realizing hysteresis characteristics. The output level switching circuit 35 is used to switch and output the output voltage between the positive direct current voltage (+5 volts) and the negative direct current voltage (−5 volts).

The input terminal 26 is connected to a base electrode of the multi-collector transistor 32, and emitter electrodes of the multi-collector transistors 32 and 33 are commonly connected to the high potential power supply line 27 through the constant current source 31.

Note, the reference voltage control circuit 34 is used to obtain the hysteresis characteristics accompanied with the multi-collector transistors 32 and 33, and the reference voltage control circuit 34 is constituted by a constant current source 36, diodes 37, 38, 39, and NPN type transistors 40, 41, 42. The diodes 37, 38 and 39 are connected in series, and an anode of the diode 37 is connected to a base electrode of the multi-collector transistor 33 and to the high potential power supply line 27 through the constant current source 36. Further, a cathode of the diode 39 is connected to the ground line (GND) 28.

As shown in FIG. 5, a base electrode of the transistor 40 is connected to a collector electrode of itself, a base electrode of the transistor 41, and one collector 32a of the multi-collector transistor 32, and an emitter electrode of the transistor 40 is connected to the ground line 28. Further, a collector electrode of the transistor 41 is connected to a base of the transistor 42 and one collector 33a of the multi-collector transistor 33, and an emitter electrode of the transistor 41 is connected to the ground line 28. Therefore, the transistors 41 and 42 construct a current mirror circuit of the multi-collector transistors 32 and 33 (which are differential pair transistors). Note, a collector electrode of the transistor 42 is connected to a connection portion between the diodes 37 and 38, and an emitter electrode of the transistor 42 is connected to the ground line 28.

The output level switching circuit 35 is controlled by the multi-collector transistors 32 and 33 to switch and output the output voltage between the positive direct current voltage (+5 volts) and the negative direct current voltage (−5 volts). Note, the output level switching circuit 35 is constituted by a constant current source 43, NPN type transistors 44, 45, 46.

As shown in FIG. 5, a base electrode of the transistor 44 is connected to a collector electrode of itself, a base electrode of the transistor 45, and the other collector 32b of the multi-collector transistor 32, and an emitter electrode of the transistor 44 is connected to the low potential power supply line 29. Further, a collector electrode of the transistor 45 is connected to a base of the transistor 46 and the other collector 33b of the multi-collector transistor 33, and an emitter electrode of the transistor 45 is connected to the low potential power supply line 29. Therefore, the transistors 44 and 45 construct a current mirror circuit of the multi-collector transistors 32 and 33. Note, a collector electrode of the transistor 46 is connected to the output terminal ($V_{OUT}$) 30 and to the high potential power supply line 27 through the constant current source 43, and an emitter electrode of the transistor 46 is connected to the low potential power supply line 29.

Figure 6:
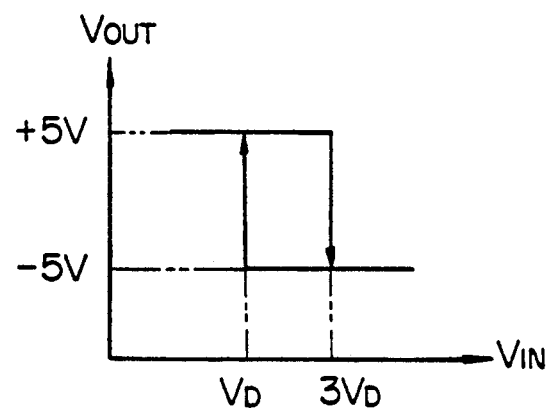
FIG. 6 is a diagram indicating hysteresis characteristics between an input voltage and an output voltage of the level converter circuit shown in FIG. 5.

FIG. 6 indicates hysteresis characteristics between an input voltage and an output voltage of the level converter circuit shown in FIG. 5.

First, when the multi-collector transistor 32 is switched ON and the multi-collector transistor 33 is switched OFF, the transistors 40 and 41 are switched ON, and the transistor 42 is switched OFF. Therefore, a level of a node 47 is specified to $3V_D$ (volts) corresponding to the sum of forward voltages of the diodes 37, 38, 39 connected in series between the node 47 and the ground line 28. Note, in this case, the transistors 44 and 45 are switched ON, and the transistor 46 is switched OFF, so that a level ($V_{OUT}$) of the output terminal 30 is specified to +5 volts (positive direct current voltage).

Conversely, when the multi-collector transistor 32 is switched OFF and the multi-collector transistor 33 is switched ON, the transistors 40 and 41 are switched OFF, and the transistor 42 is switched ON. Therefore, a level of the node 47 is specified to $V_D$ (volts) corresponding to a forward voltage of the diode 37 connected between the node 47 and the collector of the transistor 42, or connected between the node 47 and the ground line 28 through the ON-state transistor 42. Note, in this case, the transistors 44 and 45 are switched OFF, and the transistor 46 is switched ON, so that a level of the output terminal 30 is specified to −5 volts (negative direct current voltage).

As shown in FIG. 6, in the first embodiment of the level converter circuit shown in FIG. 5, the voltage $V_D$ (volts) is determined as a low level reference voltage to change the output level $V_{OUT}$ from −5 volts to +5 volts, and the voltage $3V_D$ (volts) is determined as a high level reference voltage to change the output level $V_{OUT}$ from +5 volts to −5 volts. Consequently, according to the first embodiment of the present invention, characteristics between the input voltage ($V_{IN}$) and the output voltage ($V_{OUT}$) of the level converter circuit are specified as shown in FIG. 6, and level conversion can be carried out under the specific hysteresis characteristics.

Namely, as shown in FIG. 6, when the input level $V_{IN}$ is specified to a voltage lower than the low level reference voltage $V_D$, the multi-collector transistors 32 and 33 are switched ON and OFF, so that the output level $V_{OUT}$ is determined at +5 volts. Further, when the input level $V_{IN}$ is specified to a voltage higher than the high level reference voltage $3V_D$ from the above status, the multi-collector transistors 32 and 33 are changed to switching OFF and ON states, so that the output level $V_{OUT}$ is changed to −5 volts. In addition, when the input level $V_{IN}$ is again specified to a voltage lower than the low level reference voltage $V_D$ from the above status, the multi-collector transistors 32 and 33 are again changed to switching ON and OFF states, so that the output level $V_{OUT}$ is also changed to +5 volts.

In the above described embodiment, the reference voltage control circuit 34 and the output level switching circuit 35 can be variously modified. Concretely, for example, in the reference voltage control circuit 34, the number of diodes can be determined in accordance with the designer's or the user's requirements.

Figure 7A:
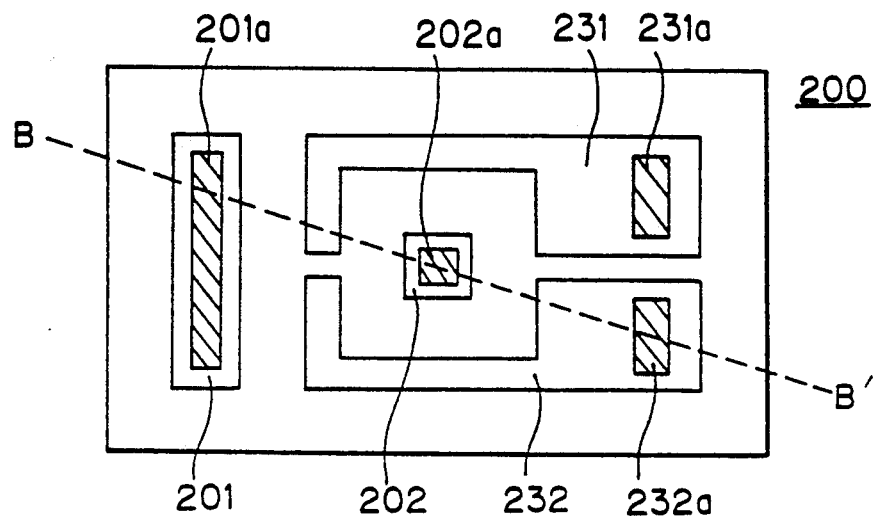
FIG. 7A is a plan diagram indicating an example of a PNP type multi-collector transistor used in the level converter circuit shown in FIG. 5.
Figure 7B:
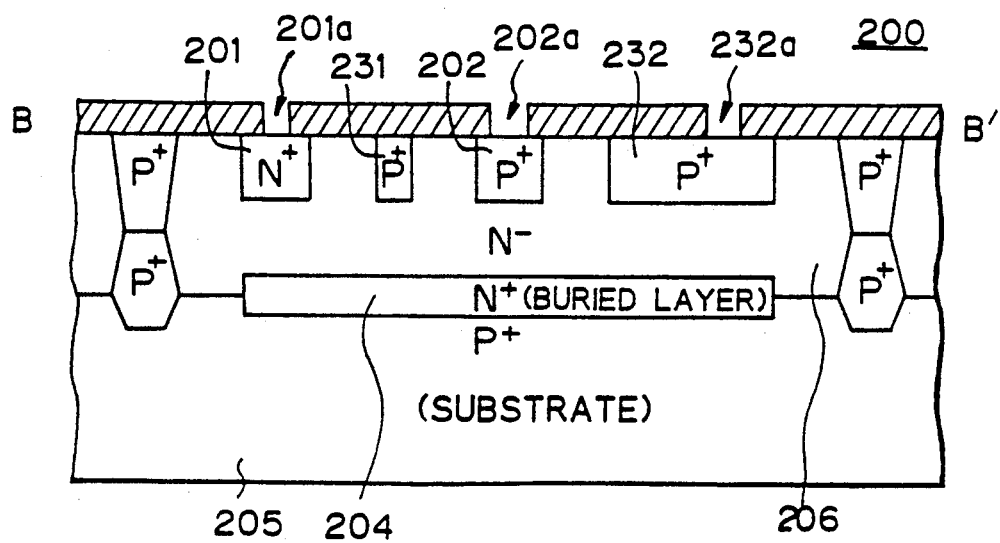
FIG. 7B is a sectional diagram indicating the PNP type single collector transistor cut along a line B—B' shown in FIG. 7A.

FIG. 7A is a plan view of an example of a PNP type multi-collector transistor used in the level converter circuit shown in FIG. 5, and FIG. 7B indicates a sectional view of the PNP type single collector transistor cut along a line B—B' shown in FIG. 7A.

In FIGS. 7A and 7B, a reference numeral 200 denotes a PNP type multi-collector transistor, or a PNP bipolar transistor having two collector electrodes, 201 denotes an N+ type base region, 202 denotes a P+ type emitter region, 231 denotes a first P+ type collector region, 232 denotes a second P+ type collector region, and 201a, 202a, 231a, and 232a denote contact holes for the base region 201, the emitter region 202, the first collector region 231, and the second collector region 232. Further, reference numeral 204 denotes an N+ type buried layer, 205 denotes a P+ type substrate, and 206 denotes an N− type transistor region.

By comparing the transistors shown in FIGS. 7A and 7B with that shown in FIGS. 4A and 4B, an occupied area of the multi-collector transistor 200 is the same as that of the single collector transistor 100. Therefore, according to the present embodiment, the circuit configuration becomes simplified and the number of the elements required for the level converter circuit becomes small. Note, the PNP type multi-collector transistor shown in FIGS. 7A and 7B is only one example, and now, various configurations of the PNP type multi-collector transistor can be provided. Additionally, these days, the PNP type multi-collector transistor, as well as various types of NPN type multi-collector transistors, or NPN bipolar transistors having two collector electrodes are available.

As described above, according to a first embodiment of a level converter circuit according to the present invention, an occupied area can be small and a circuit configuration can be simplified, and thus the level converter circuit of the first embodiment can be applied to a masterslice type LSI. Further, a chip size including the level converter circuit can be small and cost thereof can be reduced.

Figure 8:
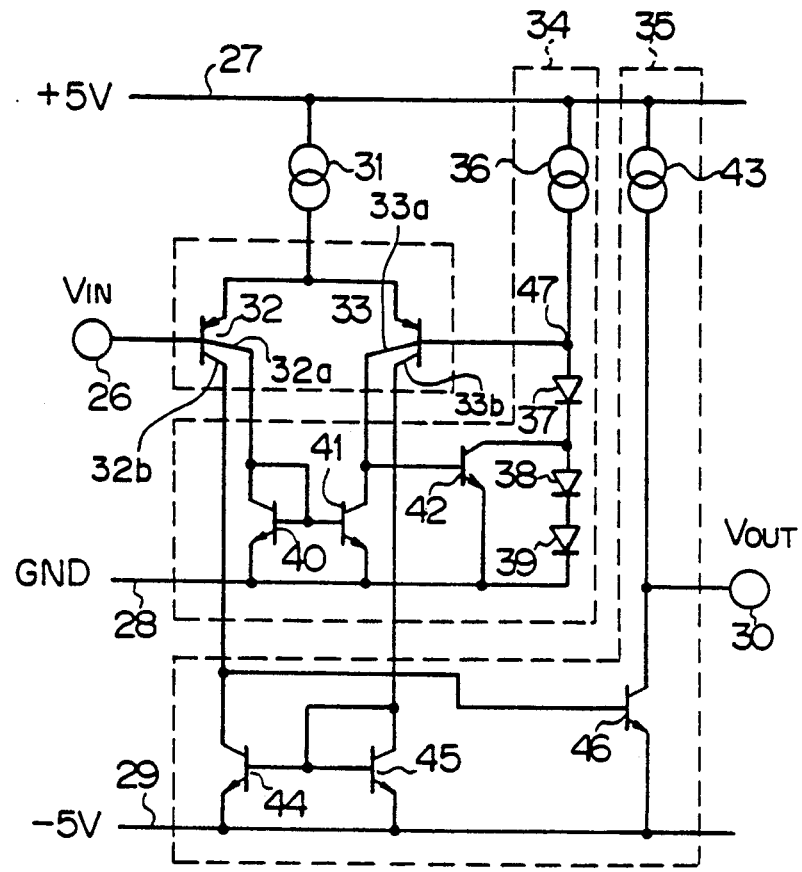
FIG. 8 is a circuit diagram indicating a second embodiment of a level converter circuit according to the present invention.

FIG. 8 indicates a circuit diagram of a second embodiment of a level converter circuit according to the present invention. In FIG. 8, the same reference numerals of this second embodiment denote the same portions of the first embodiment shown in FIG. 5, and the explanations thereof are omitted. Note, by comparing the level converter circuits of FIGS. 5 and 8, the connection relationships of the transistor 44 and 45 are different, and thus the hysteresis characteristics thereof are different or inverted.

Namely, as shown in FIG. 8, in an output level switching circuit 35, a base electrode of the transistor 45 is connected to a collector electrode of itself, a base electrode of the transistor 44, and the other collector 33b of the multi-collector transistor 33, and an emitter electrode of the transistor 45 is connected to a low potential power supply line 29. Further, a collector electrode of the transistor 44 is connected to a base of the transistor 46 and the other collector 32b of the multi-collector transistor 32, and an emitter electrode of the transistor 44 is connected to a low potential power supply line 29. Therefore, the transistors 45 and 44 construct a current mirror circuit of the multi-collector transistors 32 and 33. Note, the other configurations are the same as that of the first embodiment shown in FIG. 5.

Figure 9:
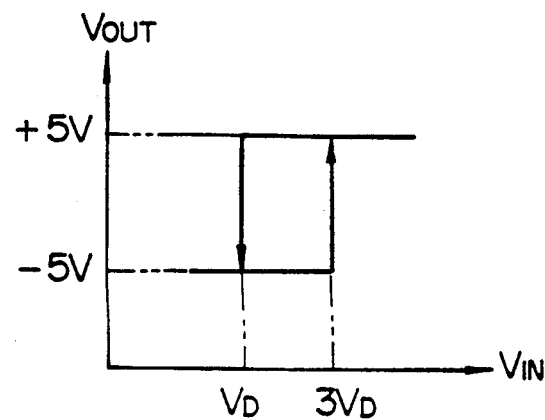
FIG. 9 is a diagram indicating hysteresis characteristics between an input voltage and an output voltage of the level converter circuit shown in FIG. 8.

FIG. 9 indicates hysteresis characteristics between an input voltage and an output voltage of the level converter circuit shown in FIG. 8.

First, when the multi-collector transistor 32 is switched ON and the multi-collector transistor 33 is switched OFF, the transistors 40 and 41 are switched ON, and the transistor 42 is switched OFF. Therefore, a level of a node 47 is specified to $3V_D$. Note, in this case, the transistors 44 and 45 are switched OFF, and the transistor 46 is switched ON, so that a level of the output terminal 30 is specified to −5 volts (negative direct current voltage).

Conversely, when the multi-collector transistor 32 is switched OFF and the multi-collector transistor 33 is switched ON, the transistors 40 and 41 are switched OFF, and the transistor 42 is switched ON. Therefore, a level of the node 47 is specified to $V_D$. Note, in this case, the transistors 44 and 45 are switched ON, and the transistor 46 is switched OFF, so that a level of the output terminal 30 is specified to +5 volts (positive direct current voltage).

As shown in FIG. 9, in the second embodiment of the level converter circuit shown in FIG. 8, the voltage $V_D$ (volts) is determined as a low level reference voltage to change the output level $V_{OUT}$ from +5 volts to −5 volts, and the voltage $3V_D$ (volts) is determined as a high level reference voltage to change the output level $V_{OUT}$ from −5 volts to +5 volts. Consequently, according to the second embodiment of the present invention, characteristics between the input voltage ($V_{IN}$) and the output voltage ($V_{OUT}$) of the level converter circuit are specified as shown in FIG. 9, and level conversion can be carried out under the specific hysteresis characteristics. As described above, by comparing FIGS. 8 and 9 with FIGS. 5 and 6, the connection relationship of the transistors 44 and 45 can be changed to change (or invert) the hysteresis characteristics. Further, a similar modification can be variously carried out in the level converter circuit according to the present invention.

Figure 10:
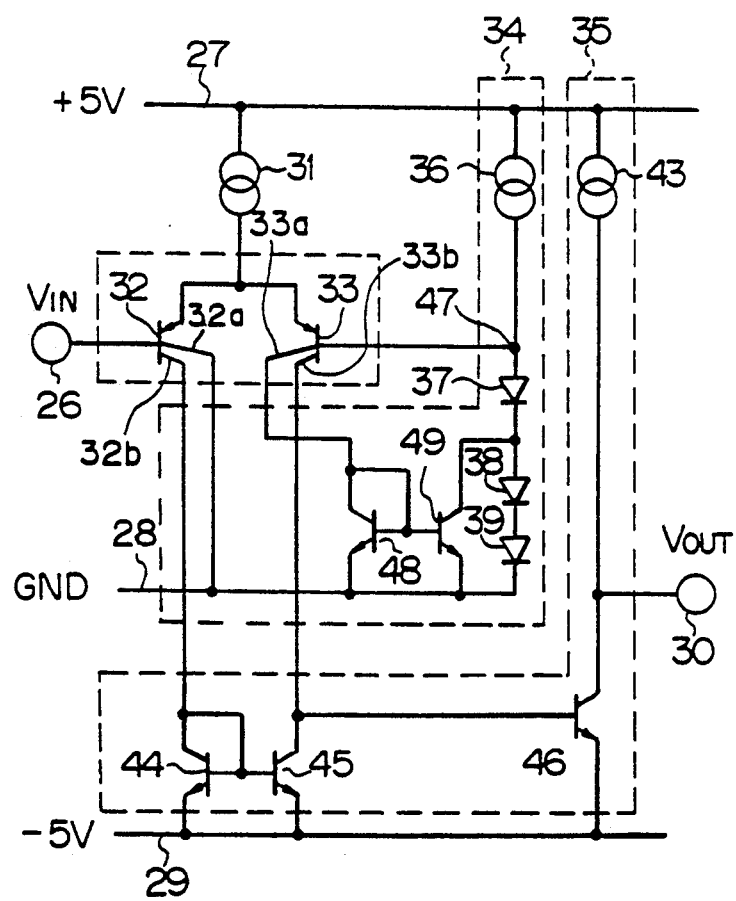
FIG. 10 is a circuit diagram indicating a third embodiment of a level converter circuit according to the present invention.

FIG. 10 indicates a circuit diagram of a third embodiment of a level converter circuit according to the present invention. In FIG. 10, the reference numerals of this third embodiment denote the same portions of the first and third embodiments shown in FIGS. 5 and 8, and the explanations thereof are omitted.

As shown in FIG. 10, in this third embodiment of the level converter circuit, one collector 32a of a multi-collector transistor 32 is directly connected to a ground line 28. Further, a reference voltage control circuit 34 is constituted by a constant current source 36, diodes 37, 38, 39, and NPN type transistors 48, 49. Note, a base electrode of the transistor 48 is connected to a collector electrode of itself, a base electrode of the transistor 49, and one collector 33a of a multi-collector transistor 33, and an emitter electrode of the transistor 48 is connected to the ground line 28. Further, a collector electrode of the transistor 49 is connected to a connection portion between the diodes 37 and 38, and an emitter electrode of the transistor 49 is connected to the ground line 28. Therefore, the transistors 48 and 49 construct a current mirror circuit of the multi-collector transistors 32 and 33 (which are differential pair transistors). In this third embodiment, the other configurations are the same as that of the first embodiment shown in FIG. 5.

Note, hysteresis characteristics between an input voltage and an output voltage of the third embodiment is the same as that of the first embodiment, and thus FIG. 6 also indicates the hysteresis characteristics of the level converter circuit shown in FIG. 10.

First, when the multi-collector transistor 32 is switched ON and the multi-collector transistor 33 is switched OFF, the transistors 48 and 49 are switched OFF, and thus a level of a node 47 is specified to 3V$_D$. Note, in this case, the transistors 44 and 45 are switched ON, and the transistor 46 is switched OFF, so that a level of the output terminal 30 is specified to +5 volts.

Conversely, when the multi-collector transistor 32 is switched OFF and the multi-collector transistor 33 is switched ON, the transistors 48 and 49 are switched ON, and thus a level of the node 47 is specified to V$_D$. Note, in this case, the transistors 44 and 45 are switched OFF, and the transistor 46 is switched ON, so that a level of the output terminal 30 is specified to −5 volts.

As shown in FIG. 6, in the third embodiment of the level converter circuit shown in FIG. 10, the voltage V$_D$ is determined as a low level reference voltage to change the output level V$_{OUT}$ from −5 volts to +5 volts, and the voltage 3V$_D$ is determined as a high level reference voltage to change the output level V$_{OUT}$ from +5 volts to −5 volts. Consequently, according to the third embodiment of the present invention, characteristics between the input voltage and the output voltage of the level converter circuit are specified as shown in FIG. 6, and level conversion can be carried out under the specific hysteresis characteristics. Note, in this third embodiment, for example, the connection relationship of the transistor 44 and 45 can be changed like the second embodiment (with reference to FIG. 8), in order to change (or invert) the hysteresis characteristics. Further, a similar modification can be variously carried out in the level converter circuit of the following forth and fifth embodiments of the present invention.

Figure 11:
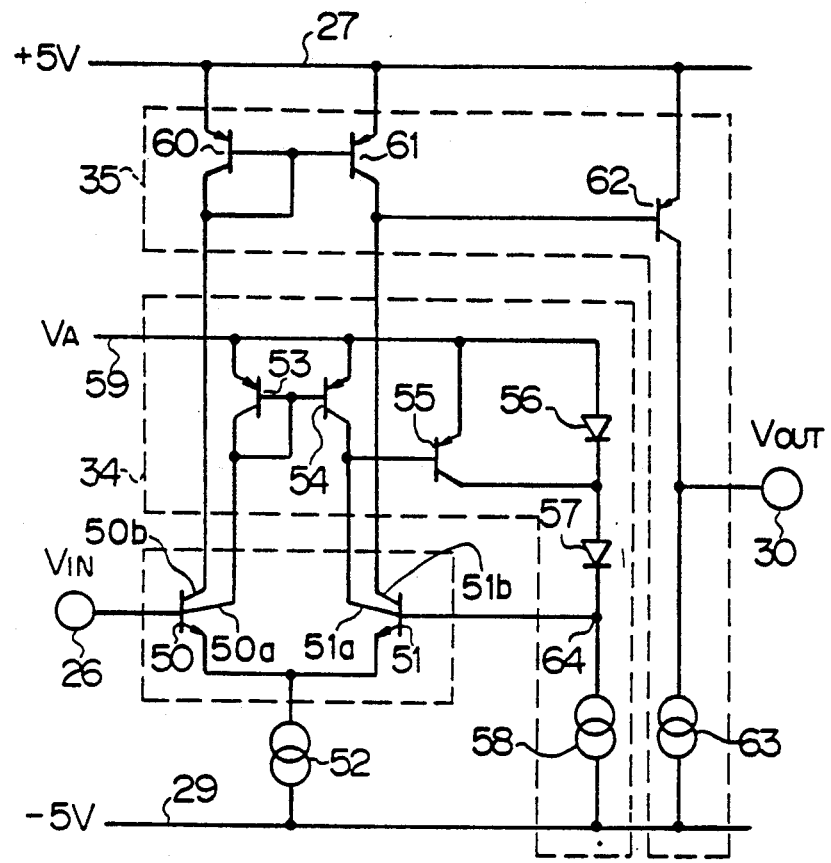
FIG. 11 is a circuit diagram indicating a fourth embodiment of a level converter circuit according to the present invention.

FIG. 11 indicates a circuit diagram of a fourth embodiment of a level converter circuit according to the present invention. Note, the reference numerals of this fourth embodiment denote the same portions of the first embodiment shown in FIG. 5, and the explanations thereof are omitted. Namely, in FIG. 11, a reference numeral 26 denotes an input terminal, 27 denotes a high potential power supply line for supplying a positive direct current voltage, e.g., +5 volts, and 29 denotes a low potential power supply line for supplying a negative direct current voltage, e.g., −5 volts. Further, a reference numeral 30 denotes an output terminal, 52 denotes a constant current source, 34 denotes a reference voltage control circuit, and 35 denotes an output level switching circuit. Nevertheless, in this fourth embodiment, differential pair transistors are constituted by two NPN multi-collector transistors 50, 51. Further, in FIG. 11, a reference numeral 59 denotes a middle potential power supply line for supplying an optional voltage between a positive direct current voltage (+5 volts) and a negative direct current voltage (−5 volts).

In this fourth embodiment, the input terminal 26 is connected to a base electrode of the NPN type multi-collector transistor 50, and emitter electrodes of the multi-collector transistors 50 and 51 are commonly connected to the low potential power supply line 29 through the constant current source 52.

The reference voltage control circuit 34 is used to obtain the hysteresis characteristics accompanied with the multi-collector transistors 50 and 51, and the reference voltage control circuit 34 is constituted by a constant current source 58, diodes 56, 57, and PNP type transistors 53, 54, 55. The diodes 56 and 57 are connected in series, and an anode of the diode 56 is connected to the middle potential power supply line (V$_A$) 59. Further, a cathode of the diode 57 is connected to the low potential power supply line 29.

As shown in FIG. 11, an emitter electrode of the transistor 53 is connected to the middle potential power supply line 59, and a base electrode of the transistor 53 is connected to a collector electrode of itself, a base electrode of the transistor 54, and one collector 50a of the multi-collector transistor 50. Further, a collector electrode of the transistor 54 is connected to a base of the transistor 55 and one collector 51a of the multi-collector transistor 51, and an emitter electrode of the transistor 54 is connected to the middle potential power supply line 59. Therefore, the transistors 53 and 54 construct a current mirror circuit of the multi-collector transistors 50 and 51 (which are differential pair transistors). Note, a collector electrode of the transistor 55 is connected to a connection portion between the diodes 56 and 57, and an emitter electrode of the transistor 55 is connected to the middle potential power supply line 59.

The output level switching circuit 35 is controlled by the multi-collector transistors 50 and 51 to switch and output the output voltage between the positive direct current voltage (+5 volts) and the negative direct current voltage (−5 volts). Note, the output level switching circuit 35 is constituted by a constant current source 63, PNP type transistors 60, 61, 62.

As shown in FIG. 11, an emitter electrode of the transistor 60 is connected to the high potential power supply line 27, and a base electrode of the transistor 60 is connected to a collector electrode of itself, a base electrode of the transistor 61, and the other collector 50b of the multi-collector transistor 50. Further, a collector electrode of the transistor 61 is connected to a base of the transistor 62 and the other collector 51b of the multi-collector transistor 51, and an emitter electrode of the transistor 61 is connected to the high potential power supply line 27. Therefore, the transistors 60 and 61 construct a current mirror circuit of the multi-collector transistors 50 and 51. Note, a collector electrode of the transistor 62 is connected to the output terminal ($V_{OUT}$) 30 and to the low potential power supply line 29 through the constant current source 63, and an emitter electrode of the transistor 62 is connected to the high potential power supply line 27.

Figure 12:
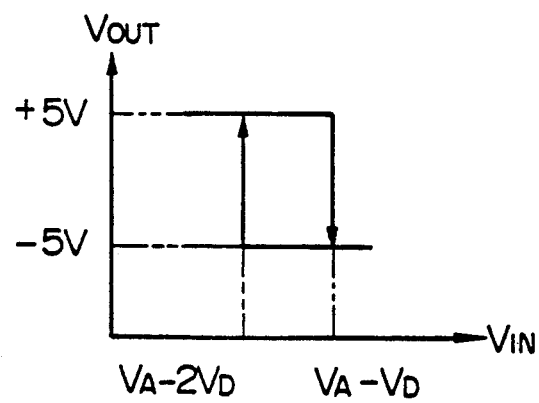
FIG. 12 is a diagram indicating hysteresis characteristics between an input voltage and an output voltage of the level converter circuit shown in FIG. 11.

FIG. 12 indicates hysteresis characteristics between an input voltage and an output voltage of the level converter circuit shown in FIG. 11.

First, when the multi-collector transistor 50 is switched OFF and the multi-collector transistor 51 is switched ON, the transistors 53 and 54 are switched OFF, and the transistor 55 is switched ON. Therefore, a level of a node 64 is specified to $V_A-V_D$ (volts) corresponding to a difference in value between a middle direct current voltage ($V_A$) and a forward voltage of the diode 57. Note, the diode 57 is connected between the node 64 and the collector of the transistor 55, or connected between the node 64 and the middle potential power supply line 59 through the ON-state transistor 55. In this case, the transistors 60 and 61 are switched OFF, and the transistor 62 is switched ON, so that a level ($V_{OUT}$) of the output terminal 30 is specified to +5 volts (positive direct current voltage).

Conversely, when the multi-collector transistor 50 is switched ON and the multi-collector transistor 51 is switched OFF, the transistors 53 and 54 are switched ON, and the transistor 55 is switched OFF. Therefore, a level of the node 64 is specified to $V_A-2V_D$ (volts) corresponding to a difference in value between the middle direct current voltage ($V_A$) and forward voltages of the diode 56 and 57 connected in series between the node 64 and the middle potential power supply line 59. In this case, the transistors 60 and 61 are switched ON, and the transistor 62 is switched OFF, so that a level of the output terminal 30 is specified to −5 volts (negative direct current voltage).

As shown in FIG. 12, in the fourth embodiment of the level converter circuit shown in FIG. 11, the voltage $V_A-2V_D$ (volts) is determined as a low level reference voltage to change the output level $V_{OUT}$ from −5 volts to +5 volts, and the $V_A-V_D$ (volts) is determined as a high level reference voltage to change the output level $V_{OUT}$ from +5 volts to −5 volts. Consequently, according to the fourth embodiment of the present invention, characteristics between the input voltage ($V_{IN}$) and the output voltage ($V_{OUT}$) of the level converter circuit are specified as shown in FIG. 12, and level conversion can be carried out under the specific hysteresis characteristics. Note, the low level reference voltage ($V_A-2V_D$) and the high level reference voltage ($V_A-V_D$) can be determined in accordance with the value of the middle direct current voltage $V_A$. Further, the configuration of the reference voltage control circuit can be variously modified, for example, the number of the diodes can be determined in accordance with designer's or user's requirements.

Figure 13:
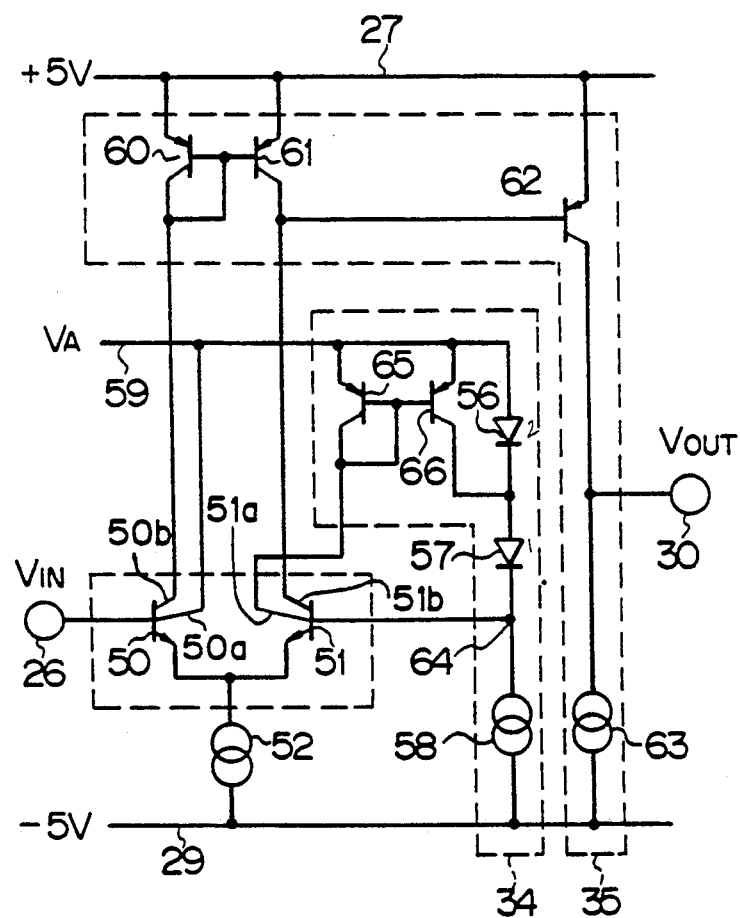
FIG. 13 is a circuit diagram indicating a fifth embodiment of a level converter circuit according to the present invention.

FIG. 13 is a circuit diagram indicating a fifth embodiment of a level converter circuit according to the present invention. Note, the same reference numerals of this fifth embodiment denote the same portions of the fourth embodiment shown in FIG. 11, and the explanations thereof are omitted.

As shown in FIG. 13, in this fifth embodiment of the level converter circuit, one collector 50a of a multi-collector transistor 50 is directly connected to a middle potential power supply line 59. Further, a reference voltage control circuit 34 is constituted by a constant current source 58, diodes 56, 57, and PNP type transistors 65, 66. Note, a base electrode of the transistor 65 is connected to a collector electrode of itself, a base electrode of the transistor 66, and one collector 51a of a multi-collector transistor 51, and an emitter electrode of the transistor 65 is connected to the middle potential power supply line 59. Further, a collector electrode of the transistor 66 is connected to a connection portion between the diodes 56 and 57, and an emitter electrode of the transistor 66 is connected to the middle potential power supply line 59. Therefore, the transistors 65 and 66 construct a current mirror circuit of the multi-collector transistors 50 and 51 (which are differential pair transistors). In this fifth embodiment, the other configurations are the same as that of the fourth embodiment shown in FIG. 11.

Note, hysteresis characteristics between an input voltage and an output voltage of the fifth embodiment is the same as that of the fourth embodiment, and thus FIG. 12 also indicates the hysteresis characteristics of the level converter circuit shown in FIG. 13.

First, when the multi-collector transistor 50 is switched OFF and the multi-collector transistor 51 is switched ON, the transistors 65 and 66 are switched ON, and thus a level of a node 64 is specified to $V_A-V_D$.

Note, in this case, the transistors 60 and 61 are switched OFF, and the transistor 62 is switched ON, so that a level of the output terminal 30 is specified to −5 volts.

Conversely, when the multi-collector transistor 50 is switched ON and the multi-collector transistor 51 is switched OFF, the transistors 65 and 66 are switched OFF, and thus a level of the node 64 is specified to $V_A-2V_D$. Note, in this case, the transistors 60 and 61 are switched ON, and the transistor 62 is switched OFF, so that a level of the output terminal 30 is specified to −5 volts.

As shown in FIG. 12, in the fifth embodiment of the level converter circuit shown in FIG. 13, the voltage $V_A-2V_D$ is determined as a low level reference voltage to change the output level $V_{OUT}$ from −5 volts to +5 volts, and the $V_A-V_D$ is determined as a high level reference voltage to change the output level $V_{OUT}$ from +5 volts to −5 volts. Consequently, according to the fifth embodiment of the present invention, characteristics between the input voltage and the output voltage of the level converter circuit are specified as shown in FIG. 12, and level conversion can be carried out under the specific hysteresis characteristics. As described above, the low level reference voltage ($V_A-2V_D$) and the high level reference voltage ($V_A-V_D$) can be determined in accordance with the value Of the middle direct current voltage $V_A$. Further, the configuration of the reference voltage control circuit can be variously modified, for example, the number of the diodes can be determined in accordance with designer's or user's requirements.

As described above, according to the above embodiments of a level converter circuit according to the present invention, an occupied area of the level converter circuit can be small and a circuit configuration can be simplified, and thus the level converter circuit can be applied to a masterslice type LSI. Further, a chip size including the level converter circuit can be small and cost thereof can be reduced.

Many widely differing embodiments of the present invention may be constructed without departing from the spirit and scope of the present invention, and it should be understood that the present invention is not limited to the specific embodiments described in this specification, except as defined in the appended claims.

We claim:

1. A level converter circuit having hysteresis characteristics between an input voltage and an output voltage, said level converter circuit comprising:

an input terminal for receiving said input voltage;
   an output terminal for outputting said output voltage;
   a first multi-collector transistor having first and second collector electrodes and a base electrode connected to said input terminal;
   a second multi-collector transistor having first and second collector electrodes and a base electrode, for constituting a differential amplifier accompanied with said first multi-collector transistor;
   a reference voltage control means, connected to the first collector electrode of said first multi-collector transistor and the first collector electrode and the base electrode of said second multi-collector transistor, for controlling a reference voltage supplied to the base electrode of said second multi-collector transistor to realize the hysteresis characteristics, said reference voltage control means including a plurality of diodes, the reference voltage of said reference voltage control means being determined in accordance with the forward voltages of said diodes, and said reference voltage control means being connected to a middle potential power supply line for supplying a middle direct current voltage; and
   an output level switching means, connected to the second collector electrode of said first multi-collector transistor, the second collector electrode of said second multi-collector transistor, and said output terminal, for switching and outputting the output voltage between a first voltage level and a second voltage level derived from a high potential power supply line and a low potential power supply line, respectively.

2. A level converter circuit as claimed in claim 1, wherein emitter electrodes of said first and second multi-collector transistors are operatively connected to a first power supply line of said first voltage level.

3. A level converter circuit as claimed in claim 1, wherein said first and second multi-collector transistors are constituted as PNP type multi-collector transistors, and emitter electrodes of said first and second multi-collector transistors are commonly connected to a high potential power supply line for supplying a positive direct current voltage through a constant current source.

4. A level converter circuit as claimed in claim 1, wherein said first and second multi-collector transistors are constituted as NPN type multi-collector transistors, and emitter electrodes of said first and second multi-collector transistors are commonly connected to a low potential power supply line for supplying a negative direct current voltage through a constant current source.

5. A level converter circuit as claimed in claim 1, wherein said middle potential power supply line is specified to the ground line.

6. A level converter circuit as claimed in claim 1, wherein said diodes are connected in series between said middle potential power supply line and said high or low potential power supply line through a constant current source, and the reference voltage of said reference voltage control means is determined by a differential value between the middle direct current voltage and the forward voltages of said diodes.

7. A level converter circuit as claimed in claim 1, wherein said reference voltage control means further comprises first and second single collector transistors constructing a current mirror circuit connected to said first and second multi-collector transistors.

8. A level converter circuit as claimed in claim 7, wherein said reference voltage control means further comprises a third single collector transistor connected to said second single collector transistor for controlling the reference voltage of said reference voltage control means.

9. A level converter circuit as claimed in claim 7, wherein said second single collector transistor controls the reference voltage of said reference voltage control means.

10. A level converter circuit as claimed in claim 1, wherein said output level switching means further comprises first and second single collector transistors constructing a current mirror circuit of said first and second multi-collector transistors.

11. A level converter circuit as claimed in claim 10, wherein said output level switching means further comprises a third single collector transistor connected to said first single collector transistor for switching and outputting the output voltage.

12. A level converter circuit having hysteresis characteristics between an input voltage and an output voltage, said level converter circuit comprising:

an input terminal for receiving said input voltage;
   an output terminal for outputting said output voltage;
   a first multi-collector transistor having first and second collector electrodes, an emitter electrode, and a base electrode connected to said input terminal;
   a second multi-collector transistor having first and second collector electrodes, an emitter electrode, and a base electrode, for constituting a differential amplifier accompanied with said first multi-collector transistor;
   a reference voltage control means, connected to the first collector electrode of said first multi-collector transistor and the first collector electrode and the base electrode of said second multi-collector transistor, for controlling a reference voltage supplied to the base electrode of said second multi-collector transistor to realize the hysteresis characteristics; and
   an output level switch means, connected to the second collector electrode of said first multi-collector transistor, the second collector electrode of said second multi-collector transistor, and said output terminal, for switching and outputting the output voltage between a first voltage level and a second voltage level, and
   said first and second multi-collector transistors being constituted as NPN type multi-collector transistors, and the emitter electrodes of said first and second multi-collector transistors being commonly connected to a low potential power supply line for supplying a negative direct current voltage through a constant current source.

13. A circuit coupled to receive high, middle and low voltage levels, comprising:

a first multi-collector transistor having an emitter, a base, and first and second collectors;

a second multi-collector transistor having an emitter coupled to the emitter of the first multi-collector transistor, a base and first and second collectors;

a first transistor having a collector coupled to the first collector of the first multi-collector transistor, a base coupled to the collector of the first transistor, and an emitter coupled to the middle voltage level;

a second transistor having a collector coupled to the first collector of the second multi-collector transistor, a base coupled to the base of the first transistor, and an emitter coupled to the middle voltage level;

a third transistor having a collector, a base coupled to the collector of the second transistor and an emitter coupled to the middle voltage level;

a first diode having an anode coupled to the base of the second multi-collector transistor and a cathode coupled to the collector of the third transistor;

a second diode having an anode coupled to the collector of the third transistor and a cathode;

a third diode having an anode coupled to the cathode of the second diode, and a cathode coupled to middle voltage level;

a fourth transistor having a collector coupled to the second collector of the first multi-collector transistor, a base coupled to the collector of the fourth transistor, and an emitter coupled to the low voltage level;

a fifth transistor having a collector coupled to the second collector of the second multi-collector transistor, a base coupled to the base of the fourth transistor, and an emitter coupled to the low voltage level;

a sixth transistor having a collector, a base coupled to the collector of the fifth transistor, and an emitter coupled to the low voltage level;

a first constant current source coupled between the high voltage level and the emitters of the first and second multi-collector transistors;

a second constant current source coupled between the high voltage level and the anode of the first diode; and a third constant current source coupled between the high voltage level and the collector of the sixth transistor, the base of the first multi-collector transistor serving as an input to the circuit, and the collector of the sixth transistor serving as the output of the circuit.

14. A circuit coupled to receive high, middle and low voltage levels, comprising:

a first multi-collector transistor having an emitter, a base, and first and second collectors;

a second multi-collector transistor having an emitter coupled to the emitter of the first multi-collector transistor, a base and first and second collectors;

a first transistor having a collector coupled to the first collector of the first multi-collector transistor, a base coupled to the collector of the first transistor, and an emitter coupled to the middle voltage level;

a second transistor having a collector coupled to the first collector of the second multi-collector transistor, a base coupled to the base of the first transistor, and an emitter coupled to the middle voltage level;

a third transistor having a collector, a base coupled to the collector of the second transistor and an emitter coupled to the middle voltage level;

a first diode having an anode coupled to the base of the second multi-collector transistor and a cathode coupled to the collector of the third transistor;

a second diode having an anode coupled to the collector of the third transistor and a cathode;

a third diode having an anode coupled to the cathode of the second diode, and a cathode coupled to middle voltage level;

a fourth transistor having a collector coupled to the second collector of the first multi-collector transistor, a base coupled to the collector of the fourth transistor, and an emitter coupled to the low voltage level;

a fifth transistor having a collector coupled to the second collector of the second multi-collector transistor, a base coupled to the base of the fourth transistor, and an emitter coupled to the low voltage level;

a sixth transistor having a collector, a base coupled to the collector of the fourth transistor, and an emitter coupled to the low voltage level;

a first constant current source coupled between the high voltage level and the emitters of the first and second multi-collector transistors;

a second constant current source coupled between the high voltage level and the anode of the first diode; and a third constant current source coupled between the high voltage level and the collector of the sixth transistor, the base of the first multi-collector transistor serving as an input to the circuit, and the collector of the sixth transistor serving as the output of the circuit.

15. A circuit coupled to high, middle and low voltage levels, comprising:

a first multi-collector transistor having an emitter, a base, a first collector coupled to the middle voltage level and a second collector;

a second multi-collector transistor having an emitter coupled to the emitter of the first multi-collector transistor, a base and first and second collectors;

a first transistor having a collector coupled to the first collector of the second multi-collector transistor, a base coupled to the collector of the first transistor, and an emitter coupled to the middle voltage level;

a second transistor having a collector, a base coupled to the base of the first transistor, and an emitter coupled to the middle voltage level;

a first diode having an anode coupled to the base of the second multi-collector transistor and a cathode coupled to the collector of the second transistor;

a second diode having an anode coupled to the cathode of the first diode and a cathode;

a third diode having an anode coupled to the cathode of the second diode, and a cathode coupled to the middle voltage level;

a fourth transistor having a collector coupled to the second collector of the first multi-collector transistor, a base coupled to the collector of the fourth transistor, and an emitter coupled to the low voltage level;
a fifth transistor having a collector, a base coupled to the base of the fourth transistor and an emitter coupled to the low voltage level;
a sixth transistor having a collector, a base coupled to the collector of the fifth transistor and an emitter coupled to the low voltage level;
a first constant current source coupled between the high voltage level and the emitters of the first and second multi-collector transistors;
a second constant current source coupled between the high voltage level and the anode of the first diode; and
a third constant current source coupled between the high voltage level and the collector of the sixth transistor, the base of the first multi-collector transistor serving as an input to the circuit, and
the collector of the sixth transistor serving as an output of the circuit.

16. A circuit coupled to high, middle and low voltage levels, comprising:
a first multi-collector transistor having an emitter, a base and first and second collectors;
a second multi-collector transistor having an emitter coupled to the emitter of the first multi-collector transistor, a base, and first and second collectors;
a first transistor having a collector coupled to the first collector of the first multi-collector transistor, a base coupled to the collector of the first transistor, and an emitter coupled to the middle voltage level;
a second transistor having a collector coupled to the first collector of the second multi-collector transistor, a base coupled to the base of the first transistor and an emitter coupled to the middle voltage level;
a third transistor having a collector, a base coupled to the collector of the second transistor and an emitter coupled to middle voltage level;
a first diode having a cathode coupled to the base of the second multi-collector transistor and an anode coupled to the collector of the third transistor;
a second diode having a cathode coupled to the anode of the first diode and an anode coupled to the middle voltage level;
a fourth transistor having a collector coupled to the second collector of the first multi-collector transistor, a base coupled to the collector of the fourth transistor and an emitter coupled to the high voltage level;
a fifth transistor having a collector coupled to the second collector of the second multi-collector transistor, a base coupled to the base of the fourth transistor and an emitter coupled to the high voltage level;
a sixth transistor having a collector, a base coupled to the collector of the fifth transistor and an emitter coupled to the high voltage level;
a first constant current source coupled between the emitters of the first and second multi-collector transistors and the low voltage level;
a second constant current source coupled between the cathode of the first diode and the low voltage level; and
a third constant current source coupled between the collector of the sixth transistor and the low voltage level,
the base of the first multi-collector transistor serving as an input to the circuit, and
the collector of the sixth transistor serving as an output of the circuit.

17. A circuit coupled to high, middle and low voltage levels, comprising:
a first multi-collector transistor having an emitter, a base, a first collector coupled to the middle voltage level and a second collector;
a second multi-collector transistor having an emitter coupled to the emitter of the first multi-collector transistor, a base, and first and second collectors;
a first transistor having a collector coupled to the first collector of the second multi-collector transistor, a base coupled to the collector of the first transistor, and an emitter coupled to the middle voltage level;
a second transistor having a collector, a base coupled to the base of the first transistor and an emitter coupled to the middle voltage level;
a first diode having a cathode coupled to the base of the second multi-collector transistor and an anode coupled to the collector of the second transistor;
a second diode having a cathode coupled to the anode of the first diode and an anode coupled to the middle voltage level;
a third transistor having a collector coupled to the second collector of the first multi-collector transistor, a base coupled to the collector of the third transistor and an emitter coupled to high voltage level;
a fourth transistor having a collector coupled to the second collector of the second multi-collector transistor, a base coupled to the base of the third transistor and an emitter coupled to the high voltage level;
a fifth transistor having a collector, a base coupled to the collector of the fourth transistor and an emitter coupled to the high voltage level;
a first constant current source coupled between the emitter of the first and second multi-collector transistors and the low voltage level;
a second constant current source coupled between t he cathode of the first diode and the low voltage level; and
a third constant current source coupled between the collector of the fifth transistor and the low voltage level,
the base of the first multi-collector transistor being used as an input to the circuit, and
the collector of the fifth transistor being used as an output of the circuit.

* * * * *

UNITED STATES PATENT AND TRADEMARK OFFICE
CERTIFICATE OF CORRECTION

PATENT NO. : 5,262,682
DATED : November 16, 1993
INVENTOR(S) : Yoshimasa MITSUYA et al.

It is certified that error appears in the above-indentified patent and that said Letters Patent is hereby corrected as shown below:

Column 12, line 37, change "-5" to --+5--.

Column 18, line 51, delete "t" (last occurrence);
line 52, change "he" to --the--.

Signed and Sealed this

Thirty-first Day of May, 1994

Attest:

BRUCE LEHMAN

*Attesting Officer*     *Commissioner of Patents and Trademarks*